United States Patent
Ding

[19]

[11] Patent Number: 6,143,603
[45] Date of Patent: Nov. 7, 2000

[54] METHOD OF MANUFACTURING BOTTOM ELECTRODE OF A CAPACITOR

[75] Inventor: Yen-Lin Ding, Hsinchu, Taiwan

[73] Assignee: United Semiconductor Corp., Hsinchu, Taiwan

[21] Appl. No.: 09/286,021

[22] Filed: Apr. 5, 1999

[30] Foreign Application Priority Data

Feb. 12, 1999 [TW] Taiwan ................................ 88102257

[51] Int. Cl.[7] .............................................. H01L 21/8242

[52] U.S. Cl. ........................................... 438/253; 438/254

[58] Field of Search ............................... 438/3, 238–240, 438/250–256, 381, 393–399

[56] References Cited

U.S. PATENT DOCUMENTS 5,741,722  4/1998  Lee .
5,849,617  12/1998  Wu ........................................... 438/253

Primary Examiner—Jey Tsai
Attorney, Agent, or Firm—Jiawei Huang; J. C. Patents

[57] ABSTRACT

A method for manufacturing a dual-cylinder bottom electrode. Because the node contact hole is formed by self-aligned etching and the materials of the spacers are conductive materials, the node contact hole is smaller than the resolution of the photolithography. Hence, the size of the device can be greatly reduced. Furthermore, because of the dual-cylinder bottom electrode, the surface area of the bottom electrode is enlarged in a limited space. Therefore, the capacitance of the capacitor is increased.

12 Claims, 4 Drawing Sheets

METHOD OF MANUFACTURING BOTTOM ELECTRODE OF A CAPACITOR

CROSS-REFERENCE TO RELATED APPLICATION

This application claims the priority benefit of Taiwan application serial no. 88102257, filed Feb. 12, 1999 the full disclosure of which is incorporated herein by reference.

BACKGROUND OF THE INVENTION

1. Field of the Invention

The present invention relates to a method of manufacturing a semiconductor device. More particularly, the present invention relates to a method of manufacturing a dual-cylinder bottom electrode of a capacitor.

2. Description of the Related Art

DRAM is applied broadly in the field of integrated circuits devices, and more importantly, in the electronics industry. DRAMs with higher capacitance are necessary for the development of the industry. As a result, DRAMs with higher density and capacitance are of great interest and are developed by the related industry. How to keep the quality as the size of the device is reduced is now a task for the industry to overcome.

Typically, in highly integrated DRAM process, a three-dimensional capacitor is commonly used since the three-dimensional capacitor can provide a relatively large capacitance. The three-dimensional capacitor comprises stacked-type capacitors, trench-type capacitors, cylinder-type capacitors, etc.

FIG. 1 is a schematic, cross-sectional view of a bottom electrode of a conventional cylinder capacitor.

As shown in FIG. 1, a substrate 100 having gate electrodes 120 and an isolation region 110 is provided. A communal source/drain region 130 is formed in the substrate 100 between two gate electrodes 120. A silicon oxide layer 140 and a silicon nitride layer 150 are formed over the substrate 100 in sequence. A node contact hole 160 is formed to penetrate through the silicon oxide layer 140 and the silicon nitride layer 150 and expose the communal source/drain region 130. A node contact is formed to fill the node contact hole 160. A spacer 180 is formed on a portion of the sidewall of the node contact 170 protuberating from the node contact hole 160. The node contact 170 and the spacer 180 together form a bottom electrode 170 electrically coupled to the communal source/drain region 130 through the node contact 170.

As the size of the semiconductor devices is gradually decreased, the size of the node contact hole will be limited by the resolution of the photolithography. Hence, the shrinkage of the semiconductor devices is greatly limited. The enlargement of the surface of the cylinder capacitor is also limited.

SUMMARY OF THE INVENTION

The invention provides a method for manufacturing a dual-cylinder bottom electrode. By using the invention, the size of the device can be greatly reduced and the capacitance of the capacitor is increased.

To achieve these and other advantages and in accordance with the purpose of the invention, as embodied and broadly described herein, the invention provides a method for manufacturing a dual-cylinder bottom electrode. A substrate having an isolation region and a transistor formed thereon is provided, wherein the transistor has a gate electrode and a source/drain region. A first silicon oxide layer is formed over the substrate. A silicon nitride layer is formed on the first silicon oxide layer. A first doped polysilicon layer is formed on the silicon nitride layer. A second silicon oxide layer is formed on the first doped polysilicon layer. A ring-type protuberance comprising the second silicon oxide layer and the first doped polysilicon layer is formed, wherein a inner region of the ring-type protuberance exposes a portion of the first silicon oxide layer aligned with the source/drain region and an outer region of the ring-type protuberance exposes the silicon nitride layer. A first spacer and a second spacer are respectively formed on the inner sidewall of the ring-type protuberance and on the outer sidewall of the ring-type protuberance simultaneously. The second silicon oxide layer and a portion of the first silicon oxide layer exposed by the first spacer are removed to form a node contact hole, wherein the node contact hole exposes a portion of the source/drain region. A second doped polysilicon layer is formed over the substrate, filling the node contact hole. A portion of the second doped polysilicon layer is removed to expose the silicon nitride layer and to form a bottom electrode. Since the node contact hole is formed by self-aligned etching and the materials of the spacers are conductive materials, the size of the device can be greatly reduced. Incidentally, because of the dual-cylinder bottom electrode, the surface area of the bottom electrode is enlarged in a limited space. Therefore, the capacitance of the capacitor is increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
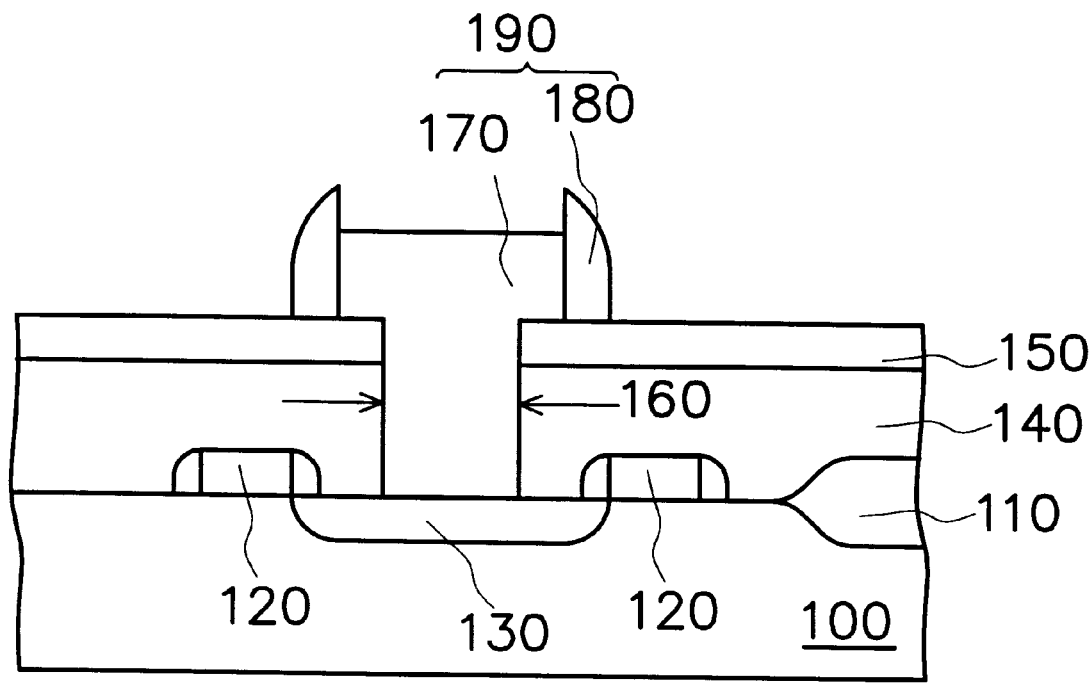
FIG. 1 is a schematic, cross-sectional view of a bottom electrode of a conventional cylinder capacitor.

Reference will now be made in detail to the present preferred embodiments of the invention examples of which are illustrated in the accompanying drawings. Wherever possible, the same reference numbers are used in the drawings and the description to refer to the same or like parts.

FIGS. 2A through 2F are schematic, cross-sectional views of the process for manufacturing a bottom electrode of a dual-cylinder capacitor in a preferred embodiment according to the invention.

Figure 2A:
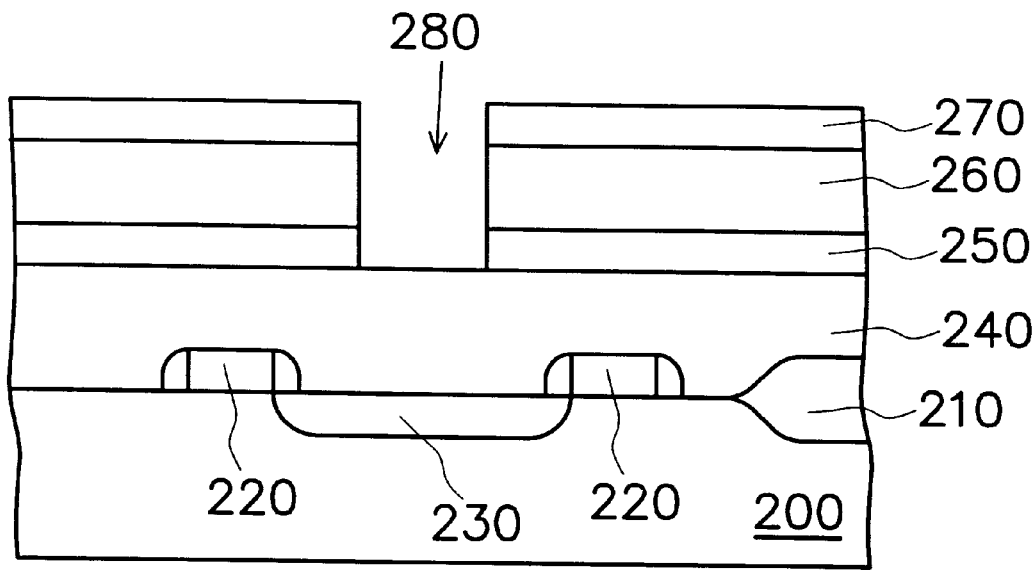
FIGS. 2A through 2F are schematic, cross-sectional views of the process for manufacturing a bottom electrode of a dual-cylinder capacitor in a preferred embodiment according to the invention.

As shown in FIG. 2A, a substrate 200 having gate electrodes 220 and at least one isolation region 210 is provided. A communal source/drain region 230 is formed in the substrate 200 between two gate electrodes 220. Dielectric layers 240 and 250, a conductive layer 260 and a dielectric layer 270 are formed on the substrate 200. the isolation region 210 and the gate electrodes 220 in sequence. Preferably, the material of the dielectric layer 240 and that of the dielectric layer 270 are the same and the dielectric layers 240 and 270 can be formed from borophosphosilicate glass (BPSG) by chemical vapor deposition (CVD), for example. Preferably, the material of the dielectric layer 250 is different from that of the dielectric layer 240. In this example, the dielectric layer 240 can be a silicon oxide layer and the dielectric layer 250 can be a silicon nitride layer. The method of forming the dielectric layer 250 can be CVD, for example. The conductive layer 260 can be formed from doped polysilicon by CVD, for example. An opening 280 aligned with the communal source/drain region 230 is formed to penetrate through the dielectric layer 270, the conductive layer 260 and the dielectric layer 250 and exposes a portion of the dielectric layer 240 above the communal source/drain region 230. The method of forming the opening 280 includes photolithography and etching, for example. In this example, the etching includes plasma etching with the proper plasma determined by the material which is to be etched. Preferably, the $CF_4$ plasma can be used in dry etching for etching a silicon oxide layer and the $CH_3F$, $CHF_3$ and $NF_3$ can be used in dry etching for etching a silicon nitride layer, for example. Moreover, the reactive ion etching (RIE) with a chloride-containing gas source can be used for etching doped polysilicon layer, for example.

Figure 2B:
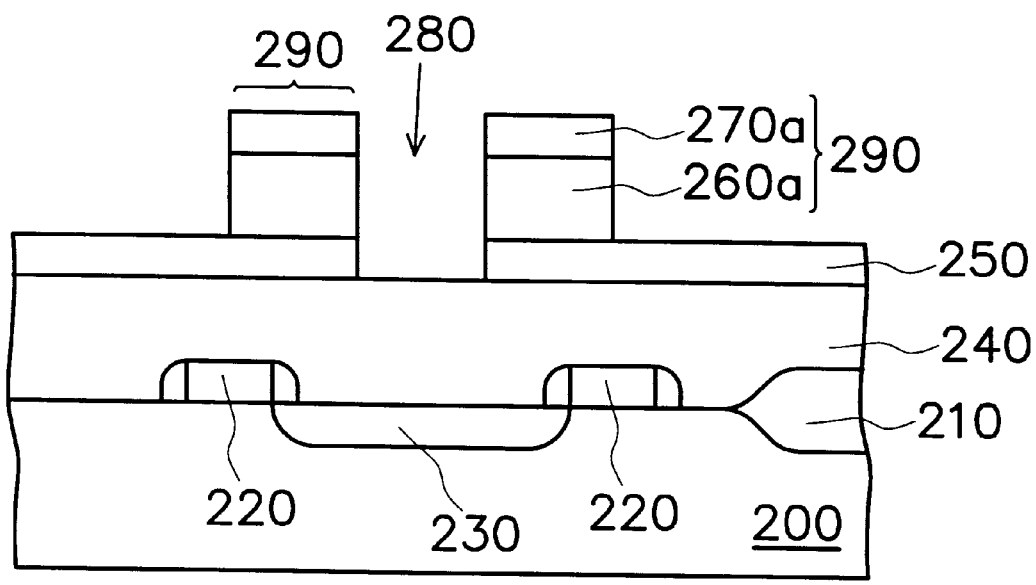

As shown in FIG. 2B, portions of the dielectric layer 270 and the conductive layer 260 are removed until a portion of the dielectric layer 250 is exposed. The remaining dielectric layer 270a and conductive layer 260a together form a ring-type protuberance region 290 surrounding the opening 280. The method of removing the portion of the dielectric layer 270 and the conductive layer 260 can be photolithography and anisotropic etching.

Figure 2C:
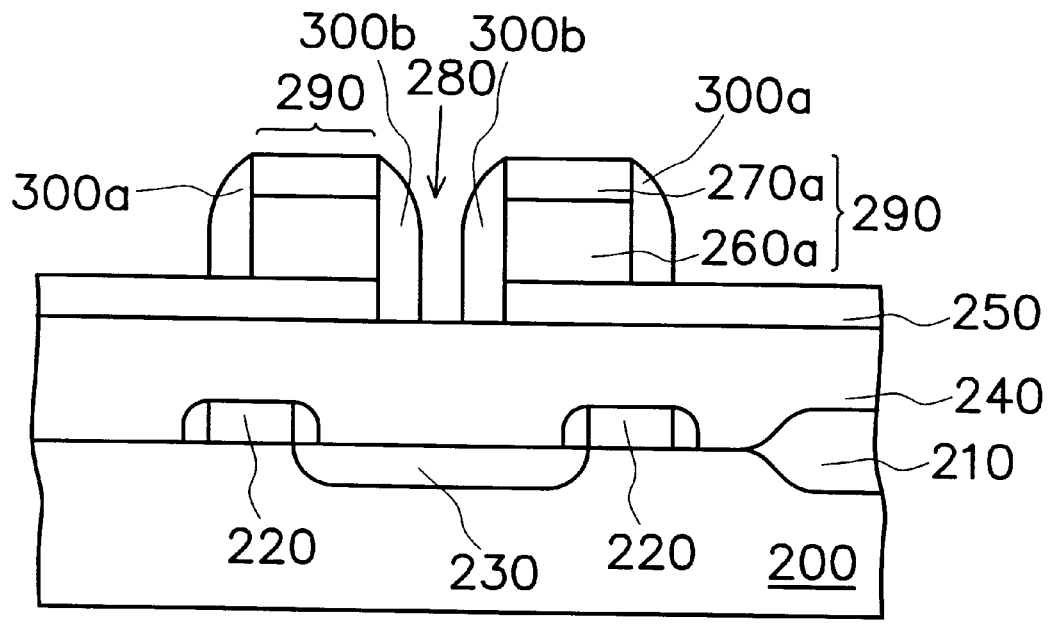

As shown in FIG. 2C, simultaneously, a spacer 300a on the outer sidewall of the ring-type protuberance 290 and a spacer 300b on the inner sidewall of the ring-type protuberance 290 and in the opening 280 are formed. The material of the spacer is a conductive material, such as doped polysilicon, for example. The method of forming the spacers 300a and 300b comprises the steps of forming a conductive layer (not shown) over the substrate 200 by CVD and etching the conductive layer to form the spacers 300a and 300b by anisotropic etching until portions of the dielectric layers 250 and 240 are exposed.

Figure 2D:
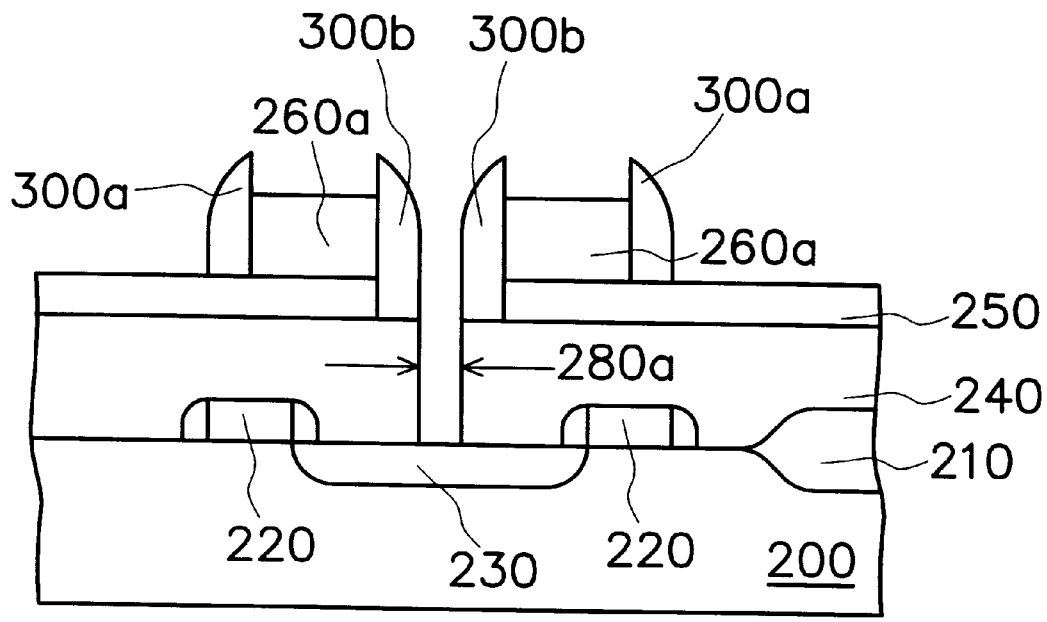

As shown in FIG. 2D, a portion of the dielectric layer 240 in the opening 280 exposed by the spacer 300b and the remaining dielectric layer 270a is removed to form a node contact hole 280a by self-aligned etching. The node contact hole 280a penetrates through the dielectric layer 240 and exposes the communal source/drain region 230. Since the remaining dielectric layer 270a is removed, the spacers 300a and 300b are salient to the conductive layer 260a. Because of the self-aligned etching, a node contact hole 280a that is smaller than the resolution of the photolithography can be formed without using a photomask. Since the spacer 300b is formed on the sidewall of the opening 280, the node contact hole 280a is smaller than the opening 280. Additionally, the spacers 300a and 300b and the conductive layer 260a together form a dual-cylinder structure.

Figure 2E:
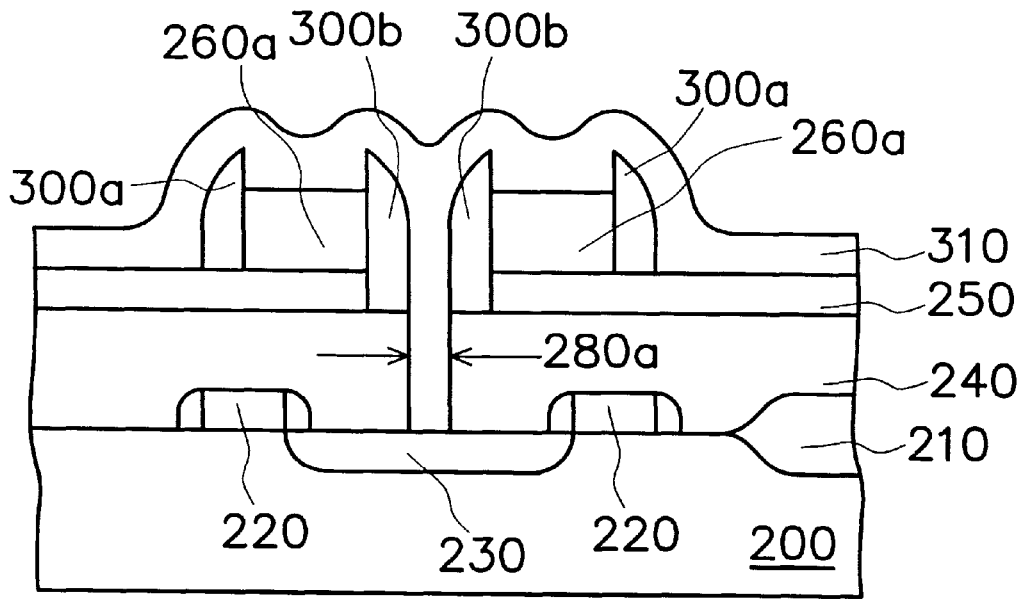

As shown in FIG. 2E, a conductive layer 310 is formed over the substrate 200 and fills the node contact hole 280a. The method of forming the conductive layer 310 can be CVD, for example. Since CVD has relatively good step coverage and conformal deposition.

Figure 2F:
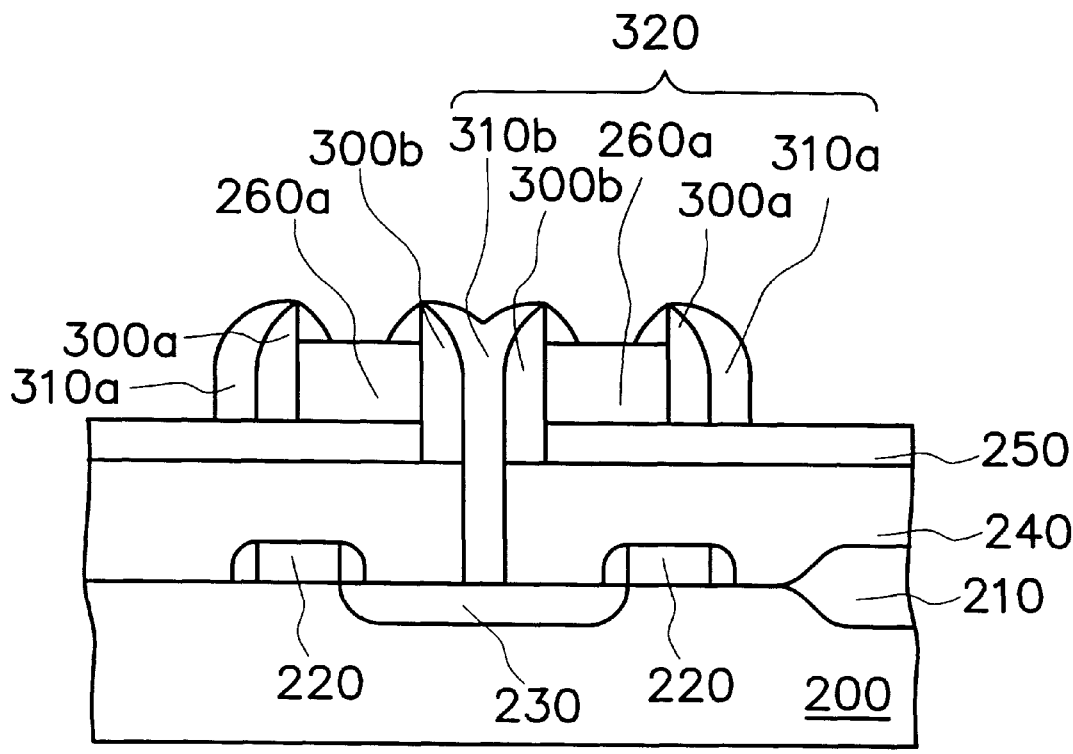

As shown in FIG. 2F, a portion of the conductive layer 310 is removed until portions of the dielectric layer 250 and the conductive layer 260a are exposed, to form a spacer 310a on the spacer 300a and a node contact 310b in the node contact hole 280a (as shown in FIG. 2E). The node contact 310b, spacers 300a, 300b and 310a and the conductive layer 260a together form a dual-cylinder bottom electrode 320 of a capacitor. The materials of the node contact 310b, spacers 300a, 300b and 310a and the conductive layer 260a are all the same and the preferred material is doped polysilicon, for example. A dielectric layer (not shown) is formed on the bottom electrode 320. A conductive layer (not shown) is formed on the dielectric layer. A patterning step is used to pattern the dielectric layer and the conductive layer to form an upper electrode. The dielectric layer can be a nitride-oxide-nitride layer.

The present invention includes the following advantages:

1. In the invention, the node contact hole is formed by self-aligned etching and the materials of the spacers are conductive materials, so that the node contact hole is smaller than the resolution of the photolithography. Hence, the size of the device can be greatly reduced.

2. In the invention, because of the dual-cylinder bottom electrode, the surface area of the bottom electrode is enlarged in a limited space. Therefore, the capacitance of the capacitor is increased.

The present invention and the conventional process techniques are compatible, thus the present invention is suitable for manufacturers to utilize.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a dual-cylinder bottom electrode of a capacitor on a substrate having an isolation region and a transistor formed thereon, wherein the transistor has a gate electrode and a source/drain region, the method comprising the step of:

forming a first silicon oxide layer over the substrate;

forming a silicon nitride layer on the first silicon oxide layer;

forming a first doped polysilicon layer on the silicon nitride layer;

forming a second silicon oxide layer on the first doped polysilicon layer; forming an opening to penetrate through the second silicon oxide layer, the first doped polysilicon layer and the silicon nitride layer and expose a portion of the first silicon oxide layer, the opening being aligned over the source/drain region;

patterning the second silicon oxide layer and the first doped polysilicon layer into a ring-type protuberance around the opening;

forming a first spacer on the sidewall of the opening and forming a second spacer on an exterior sidewall of the ring-type protuberance, simultaneously;

removing the second silicon oxide layer and a portion of the first silicon oxide layer exposed by the first spacer to form a node contact hole, wherein the node contact hole exposes a portion of the source/drain region;

forming a second doped polysilicon layer over the substrate and filling the node contact hole; and removing a portion of the second doped polysilicon layer to expose the silicon nitride layer and to form a bottom electrode.

2. The method of claim 1, wherein the method of forming the first and the second silicon oxide layers includes chemical vapor deposition.

3. The method of claim 1, wherein the method of forming the silicon nitride layer includes chemical vapor deposition.

4. The method of claim 1, wherein the method of forming the first and the second doped polysilicon layers includes chemical vapor deposition.

5. The method of claim 1, wherein the bottom electrode comprises the first doped polysilicon layer, the first and the second spacers and the second doped polysilicon layer.

6. A method for manufacturing a dual-cylinder bottom electrode of a capacitor on a substrate having an isolation region and a transistor formed thereon, wherein the transistor has a gate electrode and a source/drain region, the method comprising the step of:

forming a first dielectric layer over the substrate;

forming a second dielectric layer on the first dielectric layer;

forming a first conductive layer on the second dielectric layer;

forming a third dielectric layer on the first conductive layer;

forming a ring-type protuberance comprising the third dielectric layer and the first conductive layer, wherein a inner region of the ring-type protuberance exposes a portion of the first dielectric layer aligned with the source/drain region and an outer region of the ring-type protuberance exposes the second dielectric layer;

forming a first spacer on the inner sidewall of the ring-type protuberance and forming a second spacer on the outer sidewall of the ring-type protuberance, simultaneously;

removing the third dielectric layer and a portion of the first dielectric layer exposed by the first spacer to form a node contact hole, wherein the node contact hole exposes a portion of the source/drain region;

forming a second conductive layer over the substrate and filling the node contact hole; and removing a portion of the second conductive layer to expose the second dielectric layer and to form a bottom electrode.

7. The method of claim 6, wherein material of the first dielectric layer and that of the third dielectric layer are the same.

8. The method of claim 7, wherein the method of forming the first and the third dielectric layers includes chemical vapor deposition.

9. The method of claim 6, wherein the method of forming the second dielectric layer includes chemical vapor deposition.

10. The method of claim 6, wherein the method of forming the first and the second conductive layers includes chemical vapor deposition.

11. The method of claim 6, wherein the bottom electrode comprises the first conductive layer, the first and the second spacers and the second conductive layer.

12. The method of claim 6, wherein the first dielectric layer includes a borophosphosilicate glass layer formed by chemical vapor deposition.

* * * * *